(12) United States Patent
Ha et al.

(10) Patent No.: US 7,209,001 B2
(45) Date of Patent: Apr. 24, 2007

(54) OFFSET COMPENSATION CIRCUIT FOR A MONITORING PHOTODIODE

(75) Inventors: Chang Woo Ha, Kyunggi-Do (KR); Kyoung Soo Kwon, Kyunggi-Do (KR); Deuk Hee Park, Seoul (KR); Sang Cheol Shin, Kyunggi-Do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 74 days.

(21) Appl. No.: 11/076,467

(22) Filed: Mar. 9, 2005

(65) Prior Publication Data
US 2006/0119424 A1  Jun. 8, 2006

(30) Foreign Application Priority Data
Dec. 3, 2004  (KR) ............... 10-2004-0101267

(51) Int. Cl.
*H03F 1/02* (2006.01)
(52) U.S. Cl. ............ 330/9; 330/254; 330/284
(58) Field of Classification Search ............ 330/9, 330/254, 284
See application file for complete search history.

(56) References Cited

U.S. PATENT DOCUMENTS

| 5,233,309 | A  | * | 8/1993 | Spitalny et al. ............. 330/84 |
| 5,515,047 | A  | * | 5/1996 | Yamakido et al. .......... 341/153 |
| 6,175,278 | B1 | * | 1/2001 | Hasegawa .................. 330/278 |
| 6,211,726 | B1 | * | 4/2001 | Daun-Lindberg et al. ... 327/536 |
| 6,310,518 | B1 | * | 10/2001 | Swanson .................... 330/282 |
| 7,068,108 | B2 | * | 6/2006 | Xu et al. .................... 330/284 |

OTHER PUBLICATIONS

Patent Abstracts of Japan for 2004120311 A published on Apr. 15, 2004.

* cited by examiner

*Primary Examiner*—Patricia Nguyen
(74) *Attorney, Agent, or Firm*—Darby & Darby

(57) ABSTRACT

Disclosed is a circuit for compensating for an offset voltage of a monitoring photodiode. After the offset voltage is measured in a photodiode test, current source and offset resistors are added according to the measured resistances, thereby compensating for the offset voltage.

16 Claims, 8 Drawing Sheets

OFFSET COMPENSATION CIRCUIT FOR A MONITORING PHOTODIODE

BACKGROUND OF THE INVENTION

Incorporation by Reference

The present application claims priority under 35 U.S.C. §119 to Korean Patent Application No. 2004-0101267 filed on Dec. 3, 2004. The content of the application is incorporated herein by reference in its entirely.

1. Field of the Invention

The present invention is in the field of a circuit for compensating for an offset voltage of a monitoring photodiode. More particularly, the present invention relates to a circuit for compensating for an offset voltage by adding current sources and offset resistances according to an offset voltage measured in a photodiode test.

2. Description of the Related Art

Since the advent of CDPs, the optical recording industry has been greatly advanced, with the development of DVDPs, CDRWs, DVDRWs, COMBOs and SUPER COMBOs. Nowadays, HDTV broadcasting requires high-speed optical recording systems for recording and storing large data such as high quality images. In this regard, there is keen competition in the development of optical pickup devices, including CDRWs, DVDRWs and Bluray recorders.

To record data on CD or DVD media by use of high-speed laser signals, an optical recorder must be supported by a fast and accurate control of laser diode power to which a technology for laser power monitoring PDIC (hereinafter referred to as "MPD" (monitoring photodiode)) is essential. Particularly, an MPD must have small absolute values of offset voltages in order to accurately monitor laser power.

With reference to FIG. 1, a circuit diagram of a conventional MPD is shown. In the MPD, a photodiode 11 converts incident laser optical signals into current signals. These current signals are transformed into voltage by an I-V amplifier 12, followed by amplification of the voltage in a GAIN amplifier 13 before being output. The DC level of the output voltage should be identical to that of the standard voltage in the absence of input optical signals. When no input optical signals exist, the output voltage is expressed as $V_{OFFSET}$. A high $V_{OFFSET}$ makes it difficult to accurately measure the quantity of optical signal incident on the photodiode 11. The $V_{OFFSET}$ is generated by error values of an OP AMP used in both the I-V amplifier 12 and the GAIN amplifier 13. The error values arise from the non-ideal characteristics of the OP-AMP. The elimination of such error values is conventionally achieved by providing a compensation current $I_{offset\_comp}$ to $R_{OFFSET}$ to control the $V_{OFFSET}$ as seen in FIG. 2.

In FIG. 2, the following equation is obtained:

$$V_{OUT}=V_{X2}+V_{IN\_OFFSET} \quad (1)$$

Detected inside of the GAIN amplifier, $V_{IN\_OFFSET}$ is caused by the fact that the GAIN amplifier is not ideal.

Also, the following relationship is established in FIG. 2:

$$V_{X2}=V_{REF}+V_{Roff} \quad (2)$$

In the circuit of FIG. 2, the current inside the GAIN amplifier is ideally zero when $V_{IN}=0$. Because the GAIN amplifier is not ideal, an input current is generated inside of the GAIN amplifier. Where the input current is expressed as $I_{b\_diff}$, $V_{Roff}=I_{b\_diff} \times R_{offset}$ is obtained. The substitution of Equation (2) into Equation (1) results in:

$$V_{OUT} = V_{REF} + V_{Roff} + V_{IN\_OFFSET} \quad (3)$$
$$= V_{X1} + (I_{b\_diff} \times R_{offset}) + V_{IN\_OFFSET}$$

When the offset compensation current $I_{offset\_comp}$ is provided as in FIG. 2, $V_{OUT}$ can be rewritten as follows:

$$V_{OUT}=V_{X1}+[(I_{b\_diff}+i_{offset\_comp})\times R_{offset}]+V_{IN\_OFFSET} \quad (4)$$

If $V_{OUT}=V_{X1}$ as in the ideal case, the following relationship can be elicited from Equation (4)

$$V_{IN\_OFFSET}=-(I_{b\_diff}+I_{offset\_comp})\times R_{offset} \quad (5)$$

Where Equation (5) is satisfied, the following is obtained:

$$V_{OUT} \approx V_{REF} \approx V_{X1} \quad (6)$$

Therefore, the offset voltage can be compensated for by additionally installing a current source 16 for providing $I_{offset\_comp}$ in the circuit as in FIG. 2 and by controlling $I_{offset\_comp}$ so as to satisfy Equation 5.

Monitoring the very minute power of laser diodes, an MPD circuit must be able to precisely measure $V_{OFFSET}$ values and thereby accurately detect the quantity of optical signals. An error allowance is typically in the range of ±12 mV, but is required to be as low as ±3 mV in some recent applications.

As described in FIGS. 1 and 2, the offset compensation circuit based on the application of the offset compensation current source can improve the offset characteristics of an MPD but only to a very limited extent. In fact, because mass-produced amplifiers have varying offset values, the conventional offset compensation circuit suffers the disadvantage of having limited compensation ability.

In this regard, Japan Pat. Laid-Open Publication No. 2004-120311 suggests a solution to the problem of limited compensation ability, disclosing that a circuit comprising two preamplifiers and a differential amplifier for differentially amplifying the output voltages of the preamplifiers can not generate an output offset voltage in output voltage by selectively switching feedback resistors connected to the amplifiers.

However, this and other known offset compensation circuits are difficult to apply to the process of producing MPDs. Accordingly, there is a clear need for an offset compensation circuit that is suitable for the production of MPD.

SUMMARY OF THE INVENTION

Accordingly, the present invention has been made keeping in mind the above problems occurring in the prior art, and an object of the present invention is to provide an MPD offset voltage compensation circuit having constant $V_{OFFSET}$ characteristics, capable of correcting and improving offset characteristics upon EDS testing.

It is another object of the present invention to provide an MPD offset voltage compensation circuit with which $V_{OFFSET}$ values are selectively corrected according to individual MPD products.

It is a further object of the present invention to improve MPD $V_{OFFSET}$ drift characteristics according to temperature, MPD optical characteristics according to temperature, and MPD production yields by improving the $V_{OFFSET}$ characteristics of an MPD.

In accordance with an embodiment of the present invention, there is provided an offset compensation circuit, comprising: an amplifying element for amplifying an input signal and outputting the signal; a power unit comprising: a main current source connected to an input terminal of the amplifying element; at least one additional current source connected to the main current source in parallel; and a switching unit, correspondingly connected to the additional current source, for switching the additional current source on or off to increase the offset voltage of the amplifying element in a discrete pattern; and a feedback resistant element connected between a different input terminal and an output terminal of the amplifying element.

In accordance with another embodiment of the present invention, there is provided an offset compensation circuit, comprising: an amplifying element for amplifying an input signal and outputting the signal; a resistor comprising: a main resistor connected to an input terminal of the amplifying element; at least one additional resistor connected to the main current source in parallel; and a switching unit, correspondingly connected to the additional resistor, for switching the additional resistor on or off to decrease the offset voltage of the amplifying element in a discrete pattern; and a feedback resistant element connected between a different input terminal and an output terminal of the amplifying element.

In accordance with a further embodiment of the present invention, there is provided an offset compensation circuit, comprising: an amplifying element for amplifying an input signal and outputting the signal; a power unit comprising: a main current source connected to an input terminal of the amplifying element; at least one additional current source connected to the main current source in parallel; and a switching unit, correspondingly connected to the additional current source, for switching the additional current source on or off to increase the offset voltage of the amplifying element in a discrete pattern; and a resistor comprising: a main resistor connected to an input terminal of the amplifying element, said input terminal being identical to that connected to the main current source; at least one additional resistor connected in parallel to the main current source; and a switching unit, correspondingly connected to the additional resistor, for switching the additional resistor on or off to decrease the offset voltage of the amplifying element in a discrete pattern; and a feedback resistant element connected between a different input terminal and an output terminal of the amplifying element.

In accordance with still a further embodiment, there is provided an offset voltage compensation method, comprising: measuring an offset voltage of an amplifying element for receiving an input signal and amplifying the signal, which is connected with at least two current sources in parallel and at lest two resistant elements in series through its one input terminal and with a feedback through a different input terminal and an output terminal; determining whether the measured offset voltage is in an operation range or not; and selectively inactivating the current sources and the resistant elements according to the measured offset voltage so as to increase or decrease the offset voltage.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
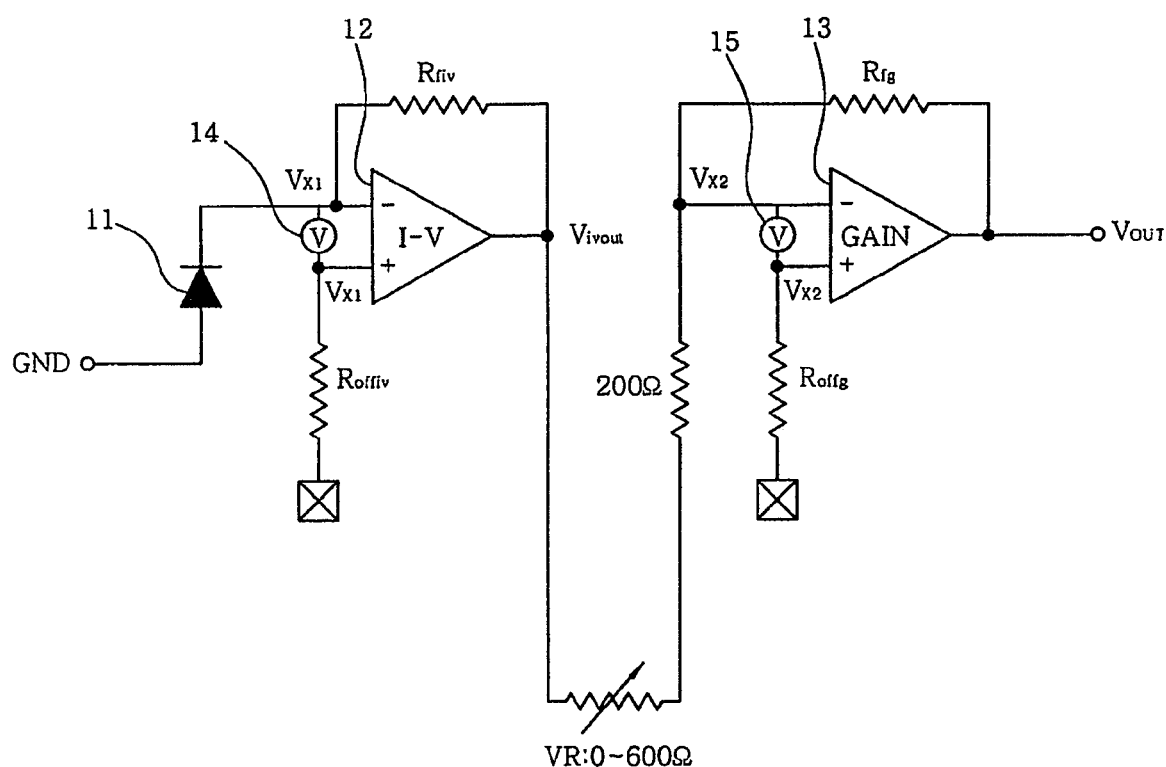
FIG. 1 is a circuit diagram showing a conventional MPD circuit structure.
Figure 2:
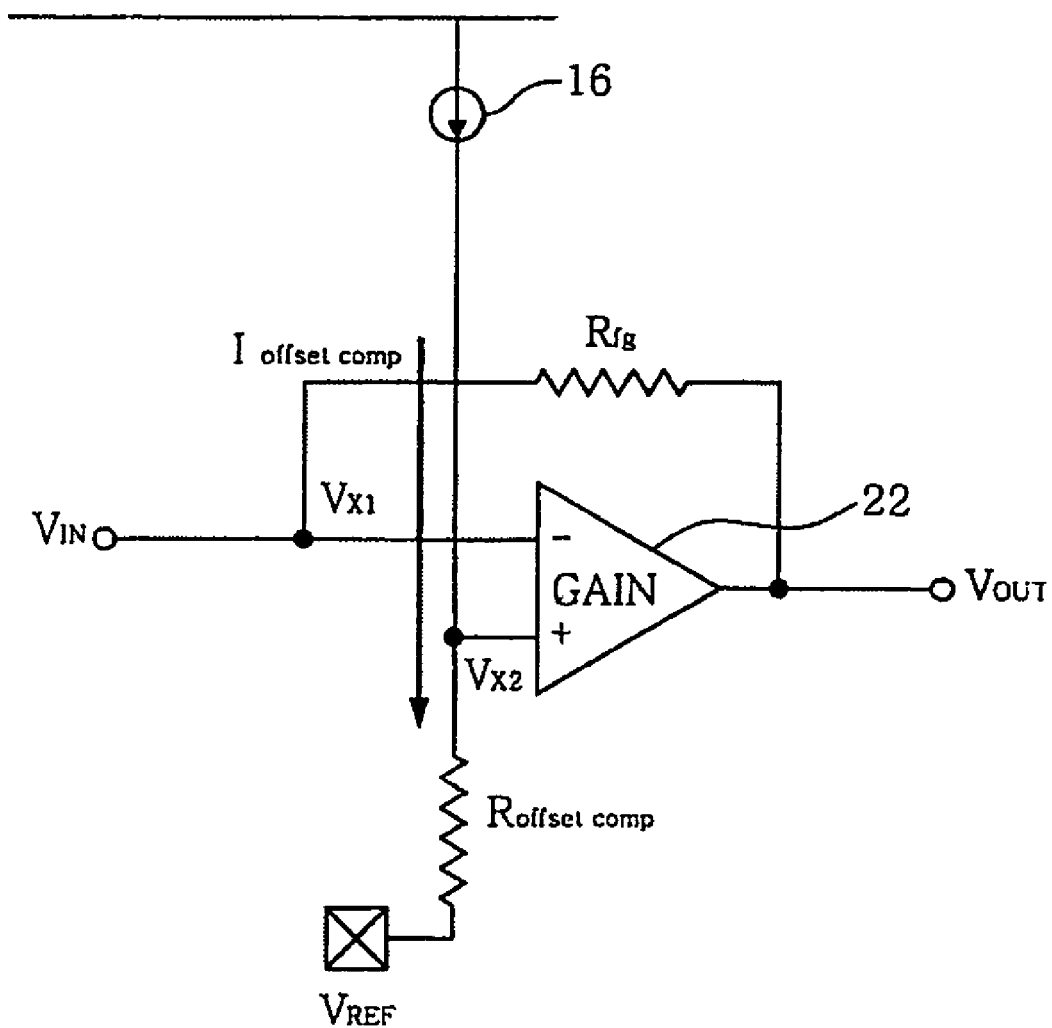
FIG. 2 is a circuit diagram showing a conventional method for compensating for an offset voltage of an MPD.

Reference should now be made to the drawings, in which the same reference numerals are used throughout the different drawings to designate the same or similar components.

Figure 3:
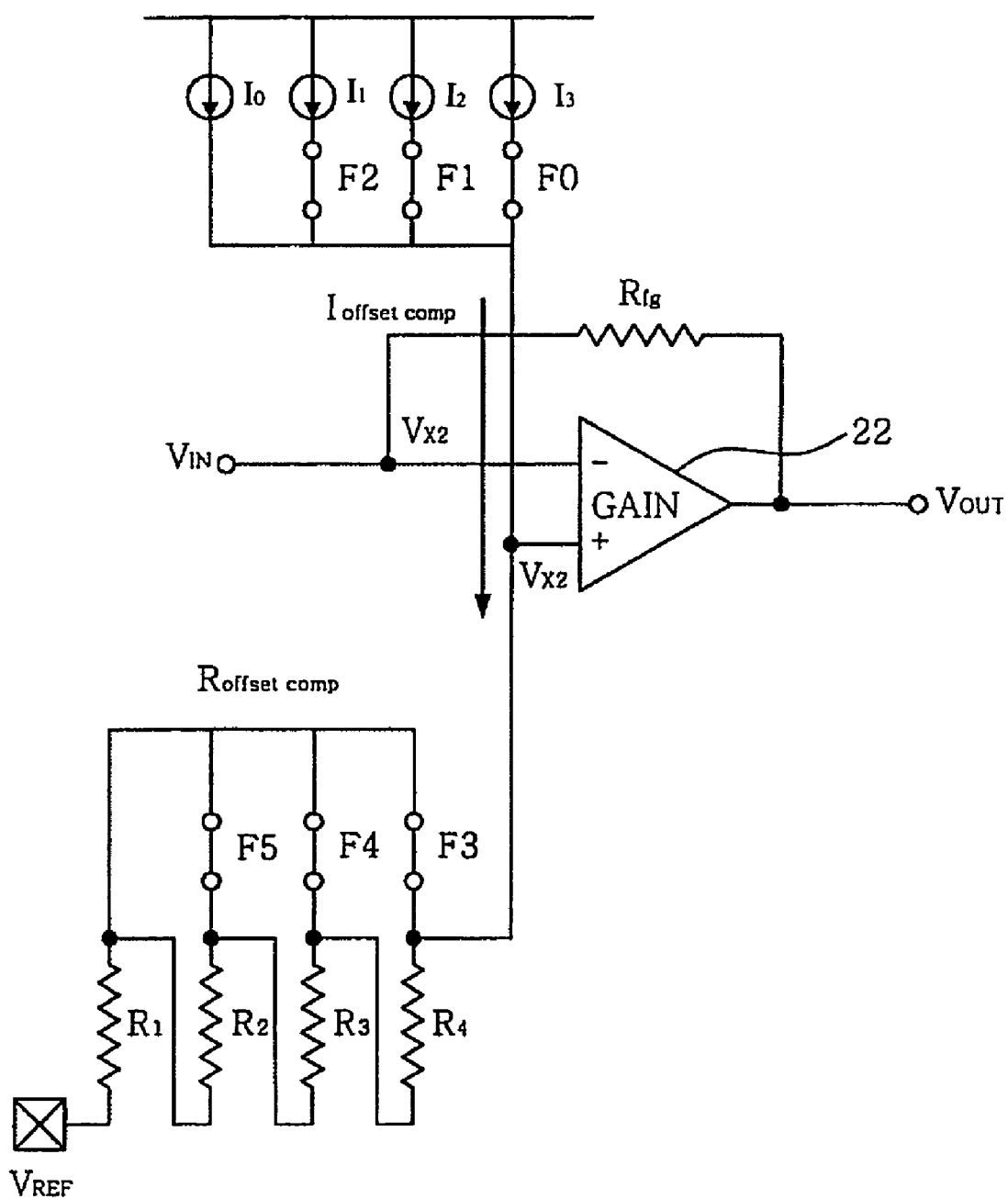
FIG. 3 is a circuit diagram showing a structure of an MPD offset voltage compensation circuit in accordance with an embodiment of the present invention.

With reference to FIG. 3, an MPD offset voltage-compensation circuit is shown in accordance with an embodiment of the present invention. As seen in this circuit diagram, a main current source $I_0$, which is connected in parallel with at least one additional current sources $I_1$, $I_2$ and/or $I_3$ is communicated with a noninverting input terminal of an amplifying element 22. A main resistor $R_1$ which is connected in series to at least one additional resistor $R_2$, $R_3$ and/or $R_4$ is also connected to the noninverting input terminal of the amplifying element 22. Fuses F3, F4 and F5 serving as switching units are respectively connected in parallel to the additional resistors R2, R3 and R4.

Interposed between the inverting input terminal and output terminal of the amplifying element 22, a feedback resistance $R_{fg}$, together with the resistance of the resistor, determines the amplification ratio of the amplifying element 22.

Before being packaged, chips including MPDs on a wafer usually undergo an electrical die sorting (EDS) test in which the chips including MPDs are tested for normal operation and repaired. The offset voltage of the amplifying element 22 can be controlled by selectively switching on or off the additional current sources $I_1$, $I_2$ and $I_3$ or the switching units connected with the additional resistors $R_2$, $R_3$ and $R_4$ in accordance with the offset voltage values measured upon the EDS testing of the MPDs. The switching unit can be selected from among a fuse or switching elements such as FET, CMOS, MOSFET, etc. If a fuse is used, its connection is an ON state while its disconnection results in an OFF state.

When used as the switching units, fuses are connected both to the additional current sources $I_1$, $I_2$ and $I_3$ and to the additional resistors $R_2$, $R_3$ and $R_4$. The control of $V_{OFFSET}$ can be accomplished by the selective disconnection of the connected fuses. For instance, when the fuses F0, F1 and/or F2 are disconnected, the additional current sources $I_1$, $I_2$ and/or $I_3$ do not supply current. On the other hand, current does not flow through the additional resistors $R_2$, $R_3$ and $R_4$ when the fuses F3, F4 and F5 are disconnected therefrom, so that the total resistance of the resistors is decreased.

Although being known, the offset voltage of a conventionally manufactured MPD cannot be controlled. In contrast, it is possible to control the offset voltage of an amplifying element according to the present invention by providing switching units after the manufacture of an MPD and selectively switching them on or off.

While inactivating corresponding additional current sources $I_1$, $I_2$ and $I_3$, the selective disconnection of the fuses F2, F1 and F0 decreases the offset compensation current $I_{offset\_comp}$ and thus the offset voltage too. By contrast, the offset voltage increases by the selective inactivation of the additional resistors $R_2$, $R_3$ and $R_4$ which results from disconnection of the corresponding fuses F5, F4 and F3 therefrom.

Therefore, if the offset voltage measured by an EDS test is higher than standard, it can be reduced into the permission range by selectively disconnecting the fuses F2, F1 and F0 from the corresponding $I_1$, $I_2$ and $I_3$. On the other hand, if the offset voltage measured by an EDS test is lower, it can be elevated into a permission range by selectively disconnecting the fuses F5, F4 and F3 from the corresponding $R_2$, $R_3$ and $R_4$.

Voltage fluctuation due to the disconnection of each of the fuses F0, F1, F2, F3, F4 and F5 depends on circuit designs and elements used in the circuit designs. The offset voltage of a typical MPD increases or decreases by ±3 mV to ±15 mV when disconnecting each fuse.

The offset compensation circuit according to the present invention is constructed within micro semiconductor integrated circuits. The disconnection of a fine fuse may require the application of a large quantity of current across the fuse or the radiation of a high temperature laser beam thereto. In the case of a current, about 10 mA is sufficient to disconnect the fuses. A high-temperature laser beam is also useful. After targeting a predetermined fuse, a laser beam is emitted. By these methods, therefore, the current sources or resistant elements are disconnected to control the offset voltage.

Figure 4:
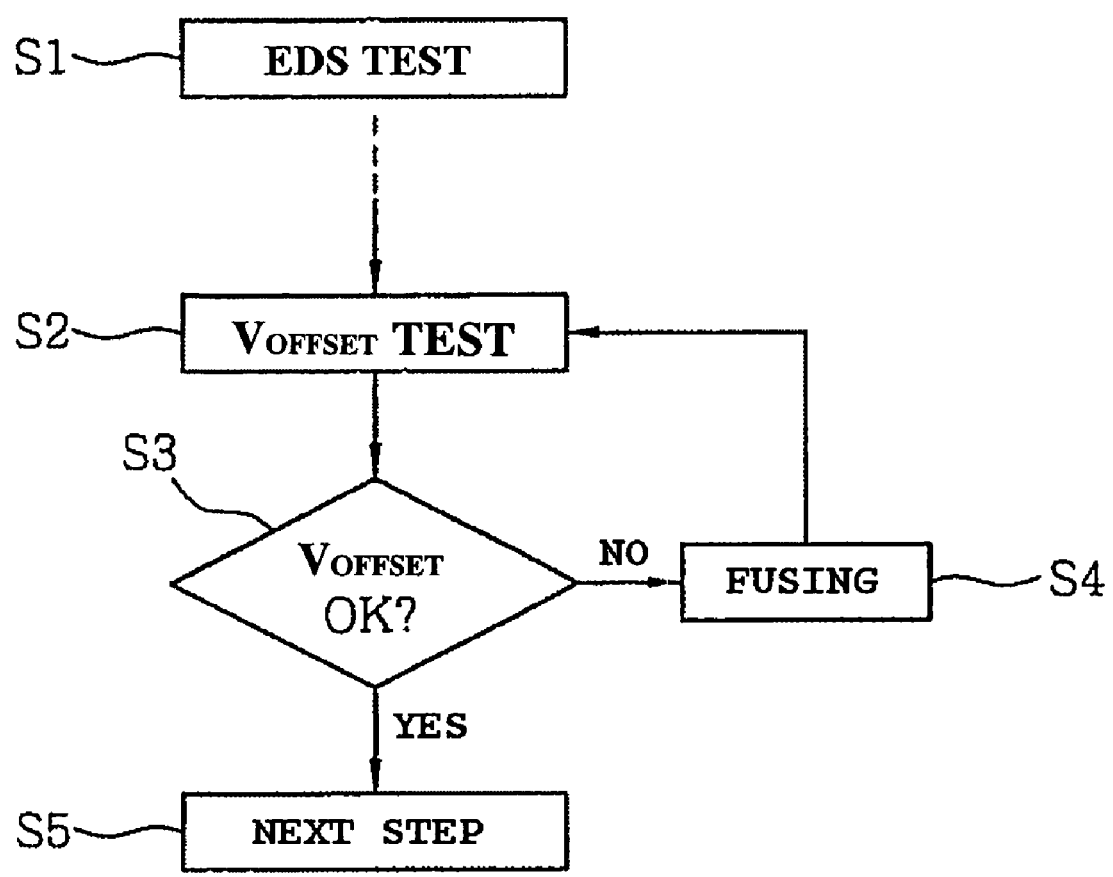
FIG. 4 is a block diagram showing a method for compensating for an offset voltage according to an embodiment of the present invention.

In FIG. 4, a flow diagram is given showing a method of compensating for an offset voltage.

In step S1, an EDS test is conducted for a wafer including an MPD and its amplification circuit. A step S2 measures the amplifying element 22 for an offset voltage $V_{OFFSET}$ when an input voltage $V_{IN}$ is zero. In step S3, whether the measured $V_{OFFSET}$ deviates from a permission range is determined. If out of the permission range, the switching units connected to the current sources or the resistant elements are switched on or off to adjust the offset voltage into the permission range. When used as the switching units, the fuses F0, F1, F2, F3, F4 and F5 are selectively disconnected to inactivate the current sources or the resistant elements, thereby adjusting the offset voltage of the amplifying element 22 in increments from ±3 mV to ±15 mV.

For example, if the measured $V_{OFFSET}$ exceeds the standard, the fuses F0, F1 and F2 are connected to the current sources to decrease the offset voltage. On the other hand, if the measured $V_{OFFSET}$ is lower than the standard, the fuses F3, F4 and F5 are selectively disconnected to increase the offset voltage.

Then, when the offset voltage is within the permission range, the wafer is allowed to be transmitted to the next processing step S5.

Figure 5:
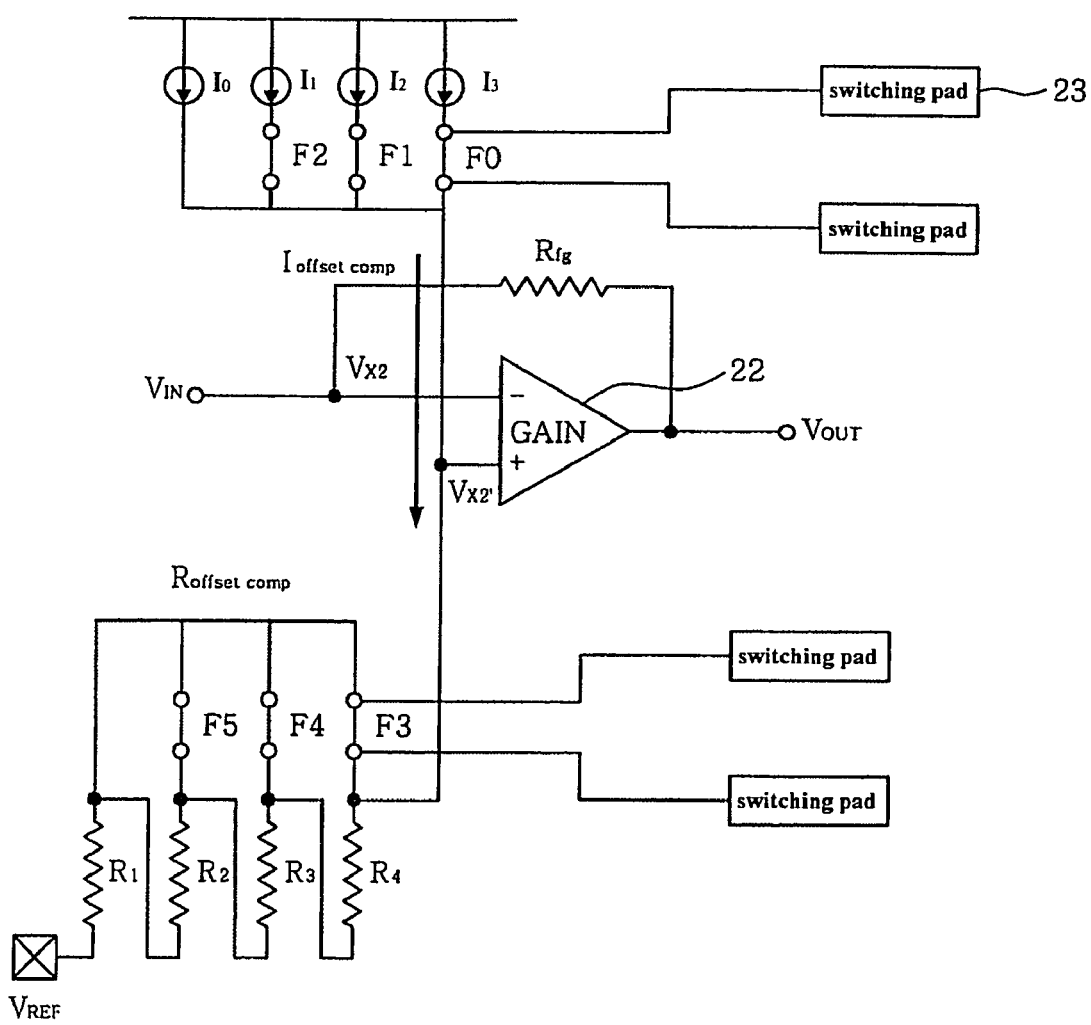
FIG. 5 is a circuit diagram showing an offset voltage compensation circuit comprising a switching pad connected to both terminals of a fuse in accordance with an embodiment of the present invention.

FIG. 5 depicts a switching method in accordance with an embodiment of the present invention. As seen in this figure, fuses serve as switching units and, connected to opposite terminals of each of the fuses, switching pads 23 are provided for supplying a large quantity of current to the fuses. The MPD must be designed to install the switching pads 23 in the wafer, along with other circuit constitutional components including the amplifying element 22.

If the fuses are selectively disconnected by applying a large current through the switching pads 23, the current sources $I_1$, $I_2$ and $I_3$ or the resistant elements $R_1$, $R_2$ and $R_3$ are inactivated to increase or decrease $V_{OFFSET}$.

Voltage fluctuation due to the disconnection of each fuse depends on the operating voltage range of other elements including the amplifying element. For a typical MPD, its offset voltage increases or decreases by ±3 mV to ±15 mV whenever disconnecting each fuse. Preferably, the fuses are designed to break at 10 mA.

Figure 6:
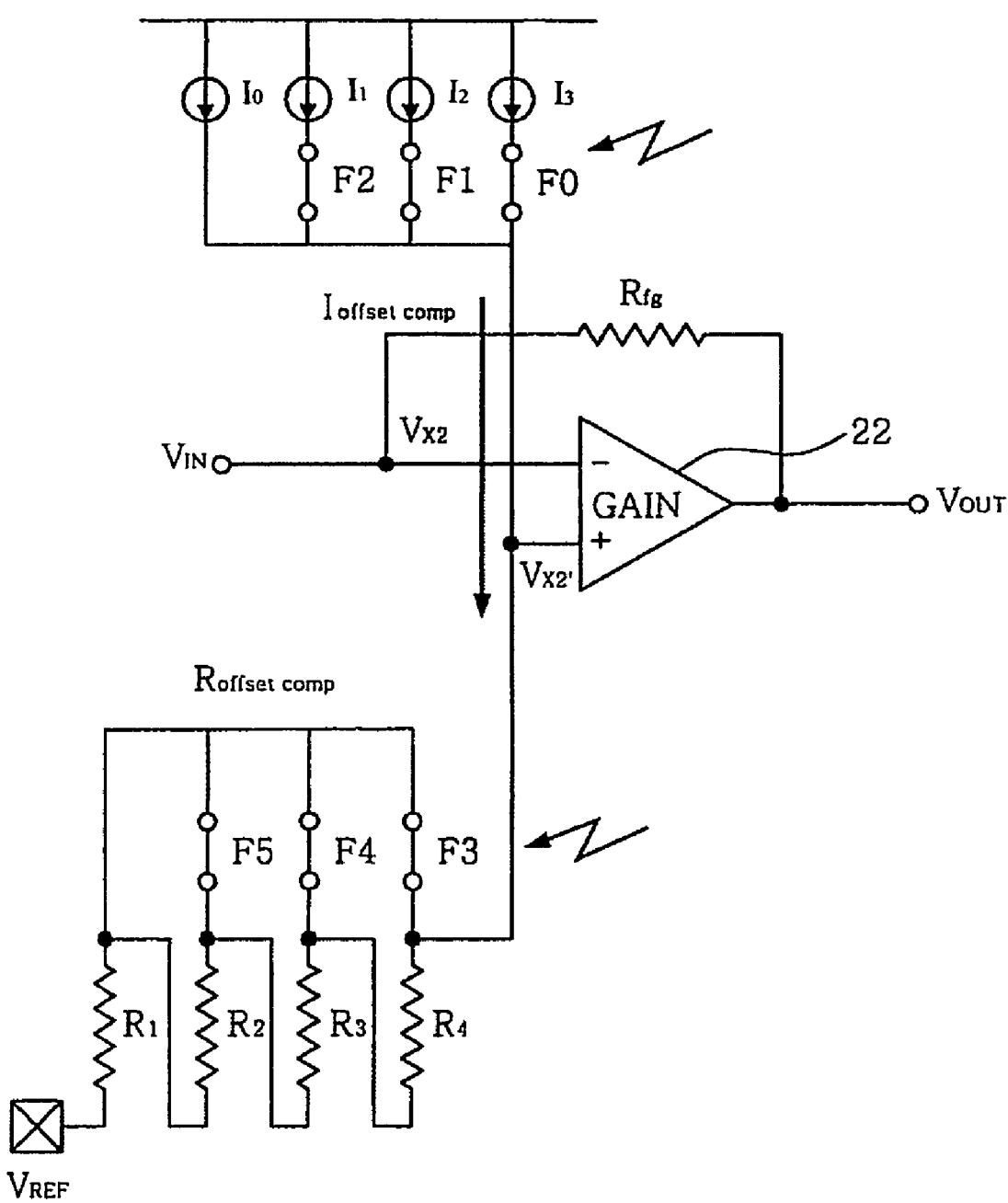
FIG. 6 depicts the disconnection of the fuses by use of a laser beam in accordance with an embodiment of the present invention.

In FIG. 6, a laser beam is used as a disconnecting means, with fuses serving as switching units, in accordance with the present invention. As seen in FIG. 6, the fuses F0, F1, F2, F3, F4 and F5 can be selectively disconnected by applying a laser beam.

According to this embodiment, switching pads or other elements for disconnecting fuses may not be additionally designed in a wafer. The disconnection of a fuse is accomplished only by radiating a laser beam thereonto after it is selected.

Figure 7:
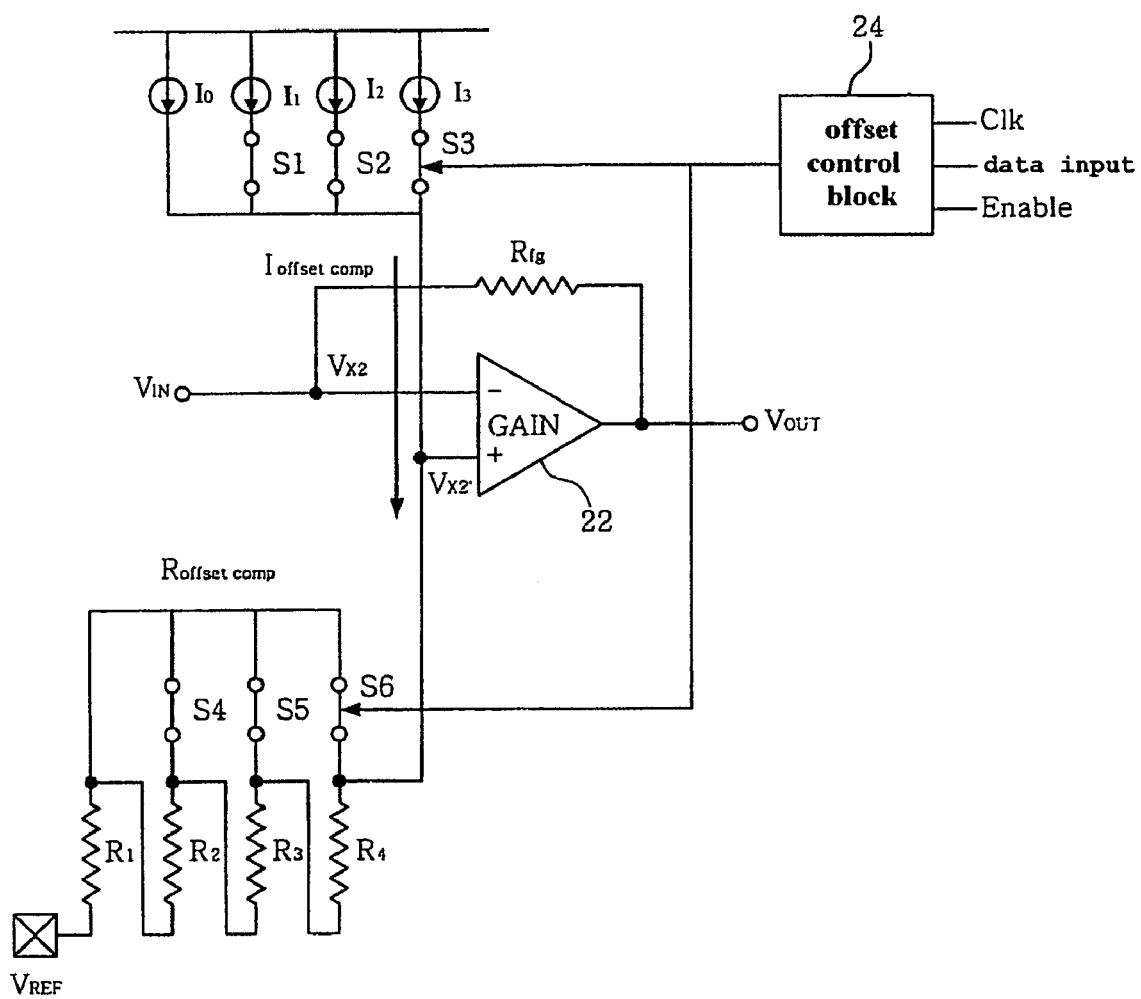
FIG. 7 is a block diagram showing an offset voltage compensation circuit comprising switching elements and an external offset control block circuit in accordance with an embodiment of the present invention.

FIG. 7 depicts an offset voltage compensation circuit which comprises an external offset control block circuit 24 for providing additional ON and OFF signals, with switching elements S1, S2, S3, S4, S5 and S6 serving as switching units which switch on or off according to the signals.

Unlike the precedents, this embodiment employs the switching elements S3, S2, S3, S4, S5 and S6, instead of the fuses. Transistor devices, such as FET, COMOS, MOSFET, etc., which are capable of switching according to digital input signals, may be used as the switching elements.

An EDS test is conducted at zero input voltage to determine whether the offset voltage of the amplifying element 22 is within a permission range. If a control is needed because the measured offset voltage is outside of the permission range, an input signal for operating the switching elements is externally transmitted through an input terminal to the offset control block 24.

After receiving external ON/OFF signals for the switching elements, the offset control block 24 selectively switches on or off the switching elements S3, S2, S3, S4, S5 and S6 according to the signals so as to inactive the current sources $I_1$, $I_2$ and $I_3$ or the resistant elements $R_1$, $R_2$ and $R_3$. Accordingly, the offset voltage $V_{OFFSET}$ is controlled.

When each of the switching elements S1, S2 and S3 is disconnected from the additional current sources $I_1$, $I_2$ and $I_3$, the offset compensation current $I_{offset\_comp}$ is decreased, thereby decreasing the offset voltage. On the other hand, the disconnection of each of the switching elements S4, S5 and S6 from the additional resistors $R_2$, $R_3$ and $R_4$ results in an increase in offset voltage.

Although the voltage fluctuation due to the disconnection of each of the switching elements depends on the operation characteristics of the amplifying element, the offset voltage is designed to increase or decrease by ±3 mV to ±15 mV in a typical MPD.

Figure 8:
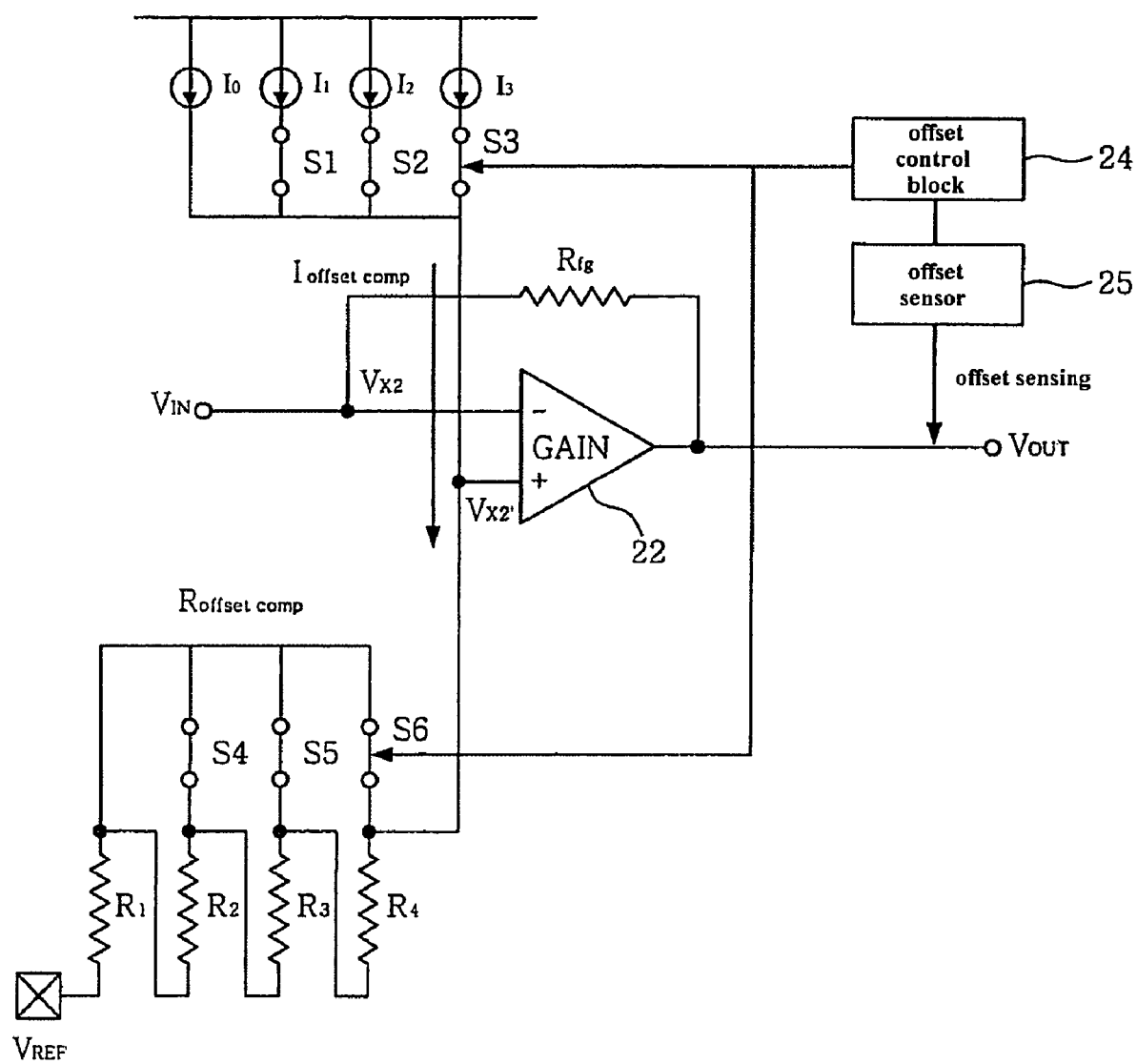
FIG. 8 is a block diagram showing an offset voltage compensation circuit capable of controlling the offset voltage while measuring the offset voltage, in accordance with an embodiment of the present invention.

FIG. 8 depicts an offset voltage compensation circuit comprising an offset control block 25 and a $V_{OFFSET}$ sensor 26 which together control a current amount and an offset resistance while measuring offset voltages, thereby dynamically compensating for the $V_{OFFSET}$.

In contrast to the offset voltage compensation circuit of FIG. 7, this circuit is not supplied with additional signals from the exterior, but uses the signals generated within itself. That is, the voltage sensor 25 senses an output voltage from which an offset voltage is determined to selectively switch the switching elements S1, S2, S3, S4, S5 and S6 on or off. The offset voltage sensor 25 may receive as an input the offset voltage measured in an EDS test or measure the offset voltage directly from the amplifying element at zero input voltage.

Preferably, sensing or controlling an offset voltage is conducted in an EDS test.

The offset compensation circuit according to the present invention enjoys the following advantages:

First, $V_{OFFSET}$ values of already manufactured MPDs can be selectively corrected according to MPD products.

Second, an improvement in $V_{OFFSET}$ characteristics results in an improvement in the $V_{OFFSET}$ drift characteristics of MPDs according to temperature.

Third, the optical efficiency of an MPD according to temperature is also improved by improving the $V_{OFFSET}$ characteristics.

Fourth, the constant $V_{OFFSET}$ characteristics of MPDs are useful in increasing the production yield.

Fifth, as for a set product in which $V_{OFFSET}$ characteristics are corrected automatically or by a logic circuit, the designer of the set product can adjust the $V_{OFFSET}$ characteristics so as to increase the compatibility of the products.

Finally, the intensity of optical signals in the optical pickup applied field can be more accurately measured by compensating for $V_{OFFSET}$ characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An offset compensation circuit, comprising:
   an amplifying element for amplifying an input signal and outputting the signal;
   a power unit comprising:
      a main current source connected to an input terminal of the amplifying element;
      at least one additional current source connected to the main current source in parallel; and
      a switching unit, correspondingly connected to the additional current source, for switching the additional current source to at least one of on and off to increase the offset voltage of the amplifying element in a discrete pattern; and
   a feedback resistant element connected between a different input terminal and an output terminal of the amplifying elements.

2. The offset compensation circuit as set forth in claim 1, wherein the switching unit comprises:
   a fuse; and
   a switching pad, connected to both ends of the fuse, for supplying a large quantity of a current therethrough to disconnect the fuse.

3. The offset compensation circuit as set forth in claim 1, wherein the switching unit comprises switching elements to switch on and off according to input signals, and an offset control block for selectively switching the switching elements on and off to increase the offset voltage of the amplifying element in a discrete pattern.

4. The offset compensation circuit as set forth in claim 1, wherein the switching unit comprises:
   switching elements that switch on and off according to input signals;
   a sensor for sensing an output voltage of the amplifying element in synchronization with the offset control block and providing the output voltage to the offset control block; and
   an offset control block for switching the switching elements on and off according to the sensed values.

5. An offset compensation circuit, comprising:
   an amplifying element for amplifying an input signal and outputting the signal;
   a resistor comprising:
      a main resistor connected to an input terminal of the amplifying element;
      at least one additional resistor connected to the main resistor in parallel; and
      a switching unit, correspondingly connected to the additional resistor, for switching the additional resistor to at least one of on and off to decrease the offset voltage of the amplifying element in a discrete pattern; and
   a feedback resistant element connected between a different input terminal and an output terminal of the amplifying element.

6. The offset compensation circuit as set forth in claim 5, wherein the switching unit comprises:
   a fuse; and
   a switching pad, connected to both ends of the fuse, for supplying a large quantity of current therethrough to disconnect the fuse.

7. The offset compensation circuit as set forth in claim 5, wherein the switching unit comprises switching elements that switch on and off according to input signals, and an offset control block for selectively switching the switching elements on and off to increase the offset voltage of the amplifying element in a discrete pattern.

8. The offset compensation circuit as set forth in claim 5, wherein the switching unit comprises:
   switching elements that switch on and off according to input signals;
   a sensor for sensing an output voltage of the amplifying element in synchronization with the offset control block and providing the output voltage to the offset control block; and
   an offset control block for switching the switching elements on and off according to the sensed values.

9. An offset compensation circuit, comprising:
   an amplifying element for amplifying an input signal and outputting the signal;
   a power unit comprising:
      a main current source connected to an input terminal of the amplifying element;
      at least one additional current source connected to the main current source in parallel; and
      a switching unit, correspondingly connected to the additional current source, for switching the additional current source to at least one of on and off to increase the offset voltage of the amplifying element in a discrete pattern; and
   a resistor comprising:
      a main resistor connected to an input terminal of the amplifying element, said input terminal being identical to that connected to the main current source;
      at least one additional resistor connected in parallel to the main resistor; and a switching unit, correspondingly connected to the additional resistor, for switching the additional resistor to at least one of on and off to decrease the offset voltage of the amplifying element in a discrete pattern; and a feedback resistant element connected between a different input terminal and an output terminal of the amplifying element.

10. The offset compensation circuit as set forth in claim 9, wherein the switching unit comprises:
 a fuse; and
 a switching pad, connected to both ends of the fuse, for supplying a large quantity of current therethrough to disconnect the fuse.

11. The offset compensation circuit as set forth in claim 9, wherein the switching unit comprises switching elements that switch on and off according to input signals, and an offset control block for selectively switching the switching elements on and off to increase the offset voltage of the amplifying element in a discrete pattern.

12. The offset compensation circuit as set forth in claim 9, wherein the switching unit comprises:
 switching elements that switch on and off according to input signals;
 a sensor for sensing an output voltage of the amplifying element in synchronization with the offset control block and providing the output voltage to the offset control block; and
 an offset control block for switching the switching elements on and off according to the sensed values.

13. An offset voltage compensation method, comprising the steps of:

measuring an offset voltage of an amplifying element for receiving an input signal and amplifying the signal, which is connected with at least two current sources in parallel and at least two resistant elements in series through its one input terminal and with a feedback through a different input terminal and an output terminal;

determining whether the measured offset voltage is in an operation range; and selectively inactivating the current sources and the resistant elements according to the measured offset voltage so as to increase or decrease the offset voltage.

14. The offset voltage compensation method as set forth in claim 13, wherein fuses are connected in parallel with the current sources and in series with the resistant elements, and the selective inactivation step comprises the selective application of a high intensity current across the fuses to selectively disconnect the fuses.

15. The offset voltage compensation method as set forth in claim 14, wherein fuses are connected in parallel with the current sources and in series with the resistant elements, and the selective inactivation step comprises the selective irradiation of a laser beam onto the fuses to selectively disconnect the fuses.

16. The offset voltage compensation method as set forth in claim 14, wherein switching elements are connected with both the current sources and the resistant elements, and the selective inactivation step comprises selectively switching the switching elements to at least one of on and off.

* * * * *